United States Patent
Kamei et al.

(10) Patent No.: US 9,896,778 B2
(45) Date of Patent: Feb. 20, 2018

(54) APPARATUS FOR PRODUCING SIC SINGLE CRYSTALS AND METHOD OF PRODUCING SIC SINGLE CRYSTALS USING SAID PRODUCTION APPARATUS

(71) Applicants: NIPPON STEEL & SUMITOMO METAL CORPORATION, Tokyo (JP); TOYOTA JIDOSHA KABUSHIKI KAISHA, Aichi (JP)

(72) Inventors: Kazuhito Kamei, Kitakyushu (JP);
Kazuhiko Kusunoki, Nishinomiya (JP);
Motohisa Kado, Gotenba (JP);
Hironori Daikoku, Susono (JP);
Hidemitsu Sakamoto, Susono (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 60 days.

(21) Appl. No.: 14/889,463

(22) PCT Filed: May 19, 2014

(86) PCT No.: PCT/JP2014/063192
§ 371 (c)(1),
(2) Date: Nov. 6, 2015

(87) PCT Pub. No.: WO2014/192573
PCT Pub. Date: Dec. 4, 2014

(65) Prior Publication Data
US 2016/0122900 A1 May 5, 2016

(30) Foreign Application Priority Data
May 31, 2013 (JP) .................................. 2013-115439

(51) Int. Cl.
*C30B 17/00* (2006.01)
*C30B 29/36* (2006.01)
*C30B 15/00* (2006.01)

(52) U.S. Cl.
CPC .............. *C30B 17/00* (2013.01); *C30B 15/00* (2013.01); *C30B 29/36* (2013.01)

(58) Field of Classification Search
CPC combination set(s) only.
See application file for complete search history.

(56) References Cited

U.S. PATENT DOCUMENTS 3,798,007 A * 3/1974 Bochman ................. C30B 15/14
117/217
5,207,992 A * 5/1993 Matsuo ..................... C30B 15/10
117/208
2011/0315073 A1* 12/2011 Sakamoto ................. C30B 9/06
117/28

FOREIGN PATENT DOCUMENTS

JP 06-48897 2/1994
JP 2007-261843 10/2007
(Continued)

*Primary Examiner* — Duy Deo
*Assistant Examiner* — Erin Bergner
(74) *Attorney, Agent, or Firm* — Clark & Brody

(57) ABSTRACT

An apparatus for producing SiC single crystals where the quality of the SiC single crystals is improved, and a production method using such an apparatus are provided. The apparatus for producing SiC single crystals according to an embodiment of the present invention is employed to produce an SiC single crystal by the solution growth method. The production apparatus includes a crucible and a support shaft. The crucible accommodates an Si—C solution. The support shaft supports the crucible. The support shaft includes a heat removing portion for removing heat from a bottom portion of the crucible. The heat removing portion includes one of (a) a contact portion having a thermal conductivity not less (Continued)

than that of the bottom portion and contacting at least a portion of the bottom portion and (b) a space adjacent to at least a portion of the contact portion or the bottom portion.

6 Claims, 14 Drawing Sheets

(56) References Cited

FOREIGN PATENT DOCUMENTS

| | | |
|---|---|---|
| JP | 2010-064914 | 3/2010 |
| JP | 2010-184838 | 8/2010 |
| JP | 2010-208926 | 9/2010 |
| JP | 2011-168447 | 9/2011 |
| JP | 2012-101960 | 5/2012 |
| JP | 2012-180244 | 9/2012 |

* cited by examiner

SiC POLYCRYSTALLINE MATERIAL

APPARATUS FOR PRODUCING SIC SINGLE CRYSTALS AND METHOD OF PRODUCING SIC SINGLE CRYSTALS USING SAID PRODUCTION APPARATUS

TECHNICAL FIELD

The present invention is related to an apparatus for producing SiC single crystals and a method of producing SiC single crystals using such a production apparatus, and, more particularly, an apparatus for producing SiC single crystals employed for the solution growth method and a method of producing SiC single crystals using such a production apparatus.

BACKGROUND ART

The solution growth method is a method of producing SiC single crystals. The solution growth method involves causing an SiC seed crystal that is an SiC single crystal to contact an Si—C solution. Si—C solution means a solution containing a melt of Si or an Si alloy in which carbon (C) is dissolved. Regions of the Si—C solution that are near the SiC seed crystal are supercooled to grow an SiC single crystal on a surface of the SiC seed crystal (i.e. crystal growth surface).

JP 2011-168447 A discloses a method of producing an SiC single crystal. This production method promotes growth of SiC polycrystalline material in locations other than those with the SiC seed crystal. More specifically, the temperature is decreased as it goes from the interior of the raw material melt toward the liquid surface of the melt, and the temperature is decreased as it goes from the interior of the raw material melt toward the bottom of the crucible. These temperature gradients prevent SiC polycrystalline material from adhering to the SiC seed crystal and its surroundings. This improves the quality of the SiC single crystal.

DISCLOSURE OF THE INVENTION

In recent years, demands have grown for further improvements in the quality of SiC single crystals.

An object of the present invention is to provide an apparatus for producing SiC single crystals where the quality of the SiC single crystals is improved, and a method of producing SiC single crystals using such a production apparatus.

An apparatus for producing an SiC single crystal according to an embodiment of the present invention is employed to produce an SiC single crystal by the solution growth method. The production apparatus includes a crucible and a support shaft. The crucible accommodates an Si—C solution. The support shaft supports the crucible. The support shaft includes a heat removing portion for removing heat from a bottom portion of the crucible. The heat removing portion includes one of (a) a contact portion having a thermal conductivity not less than that of the bottom portion and contacting at least a portion of the bottom portion, and (b) a space adjacent to at least a portion of the contact portion or the bottom portion.

The method of producing an SiC single crystal according to an embodiment of the present invention employs the above apparatus.

The apparatus for, and method of, producing SiC single crystals according to embodiments of the present invention will improve the quality of the SiC single crystals.

EMBODIMENTS FOR CARRYING OUT THE INVENTION

Figure 1:
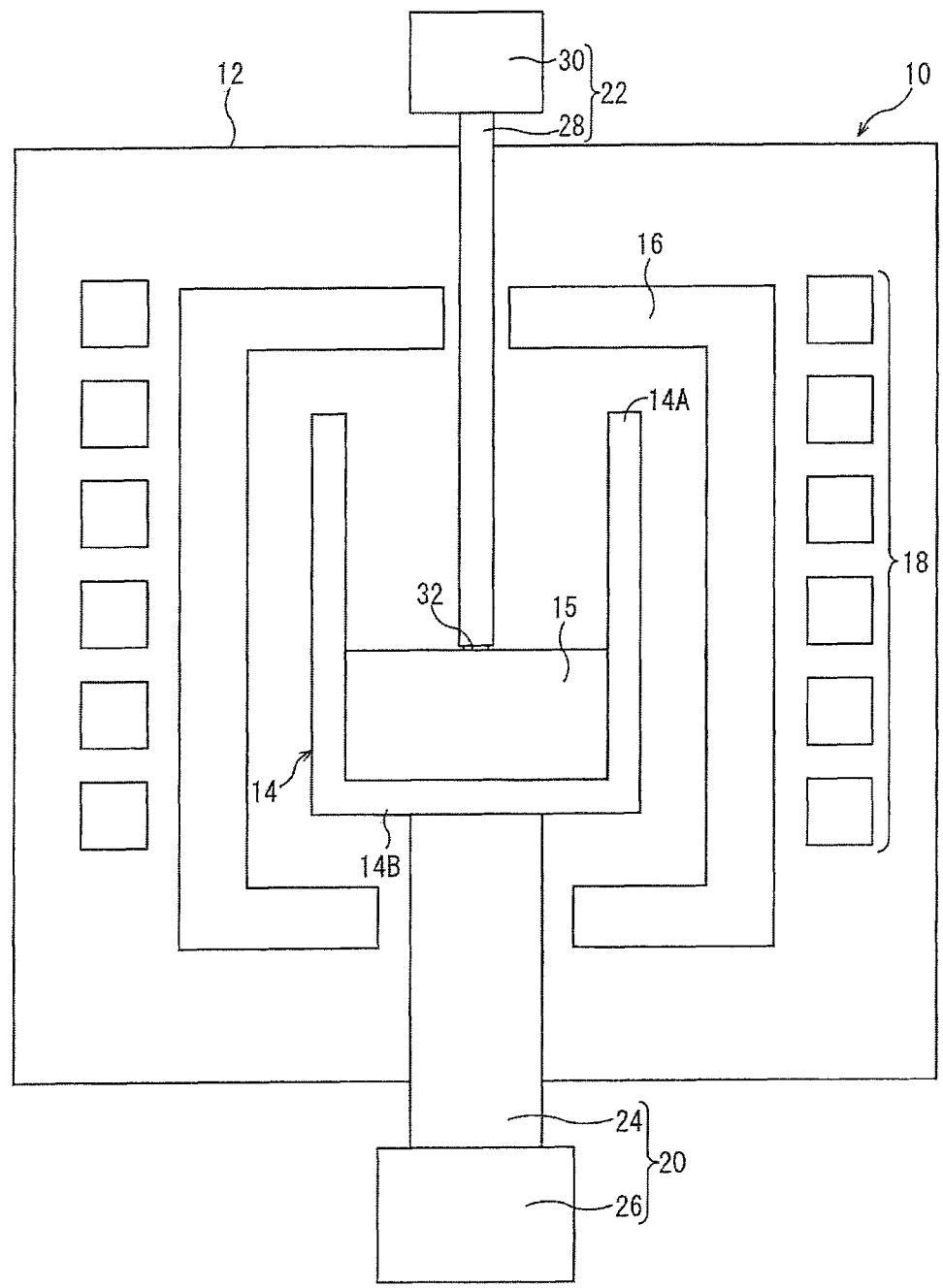
FIG. 1 is a schematic view of an apparatus for producing SiC single crystals according to an embodiment of the present invention.

An apparatus for producing an SiC single crystal according to an embodiment of the present invention is employed to produce an SiC single crystal by the solution growth method. The production apparatus includes a crucible and a support shaft. The crucible accommodates an Si—C solution. The support shaft supports the crucible. The support shaft includes a heat removing portion for removing heat from a bottom portion of the crucible. The heat removing portion includes one of (a) a contact portion having a thermal conductivity not less than that of the bottom portion and contacting at least a portion of the bottom portion, and (b) a space adjacent to at least a portion of the contact portion or the bottom portion.

In the above production apparatus, heat is removed from the bottom portion by at least one of a process in which heat is removed by radiation from the bottom portion to the space, a process in which heat is removed by radiation from the contact portion to the space, and a process in which heat is removed by heat transfer from the bottom portion to the contact portion. As heat is removed from the bottom portion, regions of the Si—C solution that are near the bottom portion are supercooled. As the regions near the bottom portion are supercooled, these regions are supersaturated with SiC. As the regions near the bottom portion are excessively supersaturated with SiC, SiC polycrystalline material is formed on the bottom portion. As the SiC polycrystalline material is formed on the bottom portion, the concentration of SiC in the Si—C solution decreases. This prevents the degree of supersaturation of regions near the SiC seed crystal with SiC from increasing excessively. As a result, SiC polycrystalline material is unlikely to be formed on and near the SiC seed crystal.

The above production apparatus is capable of causing an SiC single crystal to grow in a stable manner on an SiC seed crystal. This improves the quality of SiC single crystals.

Particularly, since the above production apparatus removes heat directly from the bottom portion, SiC polycrystalline material can be formed on the bottom portion more easily than in implementations where the heating conditions of the crucible are controlled by a high-frequency coil to create temperature gradients in regions of the Si—C solution that are near the bottom portion. This further reduces the concentration of SiC in the Si—C solution. This further prevents the degree of supersaturation of the regions near the SiC seed crystal with SiC from increasing excessively.

In the context of the above production apparatus, contact portion means a portion of the support shaft that forms a heat removal route by means of heat transfer. The contact portion may not be in direct contact with the bottom portion. For example, the contact portion may contact the bottom portion with another member located in between, that is, may be in indirect contact with the bottom portion. In such implementations, the thermal conductivity of this other member is preferably equal to or greater than the thermal conductivity of the bottom portion, or more preferably equal to or greater than the thermal conductivity of the bottom portion and equal to or greater than the thermal conductivity of the contact portion.

In the above production apparatus, the support shaft may include a shaft body and pedestal. The shaft body extends in a top-to-bottom direction. The pedestal is located on an upper end of the shaft body and contacts the bottom portion. In this case, the contact portion includes the pedestal. The shaft body and pedestal may be integrally formed or separate.

In the above production apparatus, the crucible includes a side wall extending in a top-to-bottom direction and connected with the bottom portion. Preferably, a lower end portion of the side wall has a thickness greater than that of a portion of the side wall located as high as a liquid surface of the Si—C solution. This prevents SiC polycrystalline material from being formed in a region of the side wall that contacts the liquid surface of the Si—C solution.

If the production apparatus includes the above side wall, the thickness of the lower end portion preferably decreases as it goes upward. This provides a crucible with a certain volume.

Preferably, the above production apparatus further includes a cooling unit that cools the contact portion. This facilitates removal of heat by the contact portion from the bottom portion of the crucible.

The method of producing an SiC single crystal according to an embodiment of the present invention employs the above apparatus.

Now, embodiments of the present invention will be described with reference to the drawings. The same or corresponding components in the drawings are labeled with the same characters, and their description will not be repeated.

The method of producing an SiC single crystal according to an embodiment of the present invention is based on the solution growth method. The present production method includes a preparation step, a formation step, and a growth step. The preparation step prepares a production apparatus. The formation step forms an Si—C solution. The growth step causes an SiC seed crystal to contact the Si—C solution and causes an SiC single crystal to grow. The steps will be described in detail below.

[Preparation Step]

The preparation step prepares a production apparatus to be employed in a solution growth process. FIG. 1 is a schematic view of a production apparatus 10 for the method of producing an SiC single crystal according to an embodiment of the present invention. The production apparatus 10 shown in FIG. 1 is an example of a production apparatus employed in a solution growth process. Thus, the production apparatus employed in a solution growth process is not limited to the production apparatus 10 of FIG. 1.

The production apparatus 10 includes a chamber 12, a crucible 14, a heat-insulating member 16, a heating device 18, a rotation device 20, and a hoisting device 22.

The chamber 12 contains the crucible 14. The chamber 12 is cooled when an SiC single crystal is produced.

The crucible 14 accommodates a raw material for an Si—C solution 15. The crucible 14 includes a side wall 14A and a bottom portion 14B. Preferably, the material of the crucible 14 contains carbon. Thus, the crucible 14 serves as a source of carbon for the Si—C solution 15. In the present embodiment, the crucible 14 is made of graphite.

The heat-insulating member 16 is made of a heat-insulating material, and surrounds the crucible 14.

The heating device 18 may be a high-frequency coil, for example, and surrounds the side wall of the heat-insulating member 16. The heating device 18 inductively heats the crucible 14 to form an Si—C solution 15. The heating device 18 further maintains the Si—C solution 15 at a crystal growth temperature. A crystal growth temperature is a temperature of the Si—C solution 15 at which SiC single crystals are grown. The crystal growth temperature may be 1600 to 2000° C., for example, and is preferably 1900 to 2000° C.

The rotation device 20 includes a rotation shaft 24 that serves as a support shaft, and a drive power source 26.

The rotation shaft 24 extends in the height direction of the chamber 12 (i.e. the top-to-bottom direction of FIG. 1). The upper end of the rotation shaft 24 is located in the heat-insulating member 16. The crucible 14 is positioned on the upper end of the rotation shaft 24. The lower end of the rotation shaft 24 is located outside the chamber 12.

The drive power source 26 is located below the chamber 12. The drive power source 26 is coupled to the rotation shaft 24. The drive power source 26 rotates the rotation shaft 24 about the central axis of the rotation shaft 24.

The hoisting device 22 includes a seed shaft 28 and a drive power source 30.

The seed shaft 28 extends in the height direction of the chamber 12. The upper end of the seed shaft 28 is located outside the chamber 12. An SiC seed crystal 32 is to be attached to the lower end surface of the seed shaft 28.

The drive power source 30 is located above the chamber 12. The drive power source 30 is coupled to the seed shaft 28. The drive power source 30 raises and lowers the seed shaft 28. The drive power source 30 rotates the seed shaft 28 about the central axis of the seed shaft 28.

The preparation step further prepares an SiC seed crystal 32. The SiC seed crystal 32 is an SiC single crystal. Preferably, the crystal structure of the SiC seed crystal 32 is the same as that of an SiC single crystal that is to be produced. For example, if an SiC single crystal with 4H polytype is to be produced, an SiC seed crystal 32 with 4H polytype is utilized. If an SiC seed crystal 32 with 4H polytype is utilized, the crystal growth surface is preferably the (0001) plane or the (000-1) plane or a plane inclined by an angle of not more than 8° relative to the (0001) plane or (000-1) plane. In such cases, an SiC single crystal grows in a stable manner.

When the production apparatus 10 and SiC seed crystal 32 have been prepared, the SiC seed crystal 32 is attached to the lower end surface of the seed shaft 28.

Next, the crucible 14 is positioned inside the chamber 12 and on the rotation shaft 24. At this stage, the crucible 14 already contains a material for an Si—C solution 15.

[Formation Step]

Next, an Si—C solution 15 is formed. First, the chamber 12 is filled with an inert gas. Then, the heating device 18 heats the material for an Si—C solution 15 in the crucible 14 to a temperature equal to or higher than the melting point. As discussed above, in the present embodiment, the crucible 14 is made of graphite. In that case, when the crucible 14 is heated, carbon from the crucible 14 dissolves in the melt, forming an Si—C solution 15. As more carbon from the crucible 14 dissolves in the Si—C solution 15, the carbon concentration in the Si—C solution 15 approaches the saturation level.

[Growth Step]

Next, the drive power source 30 lowers the seed shaft 28 such that the SiC seed crystal 32 is in contact with the Si—C solution 15. At this moment, the SiC seed crystal 32 may be immersed in the Si—C solution 15.

After the SiC seed crystal 32 is brought into contact with the Si—C solution 15, the heating device 18 maintains the Si—C solution 15 at the crystal growth temperature. Further, regions of the Si—C solution 15 that are near the SiC seed crystal 32 are supercooled so as to be supersaturated with SiC.

Supercooling regions of the Si—C solution 15 that are near the SiC seed crystal 32 is not limited to a particular method. For example, the heating device 18 may be controlled such that regions of the Si—C solution 15 that are near the SiC seed crystal 32 is at a temperature lower than that of the other regions. Alternatively, regions of the Si—C solution 15 that are near the SiC seed crystal 32 may be cooled by a coolant. More specifically, a coolant may be circulated inside the seed shaft 28. The coolant may be, for example, an inert gas such as helium (He) or argon (Ar). Circulating the coolant in the seed shaft 28 cools the SiC seed crystal 32. As the SiC seed crystal 32 is cooled, regions of the Si—C solution 15 that are near the SiC seed crystal 32 are cooled.

With regions of the Si—C solution 15 that are near the SiC seed crystal 32 being supersaturated with SiC, the SiC seed crystal 32 and Si—C solution 15 (i.e. crucible 14) are rotated. As the seed shaft 28 is rotated, the SiC seed crystal 32 is rotated. As the rotation shaft 24 is rotated, the crucible 14 is rotated. The direction in which the SiC seed crystal 32 is rotated may be opposite to, or the same as, the direction in which the crucible 14 is rotated. The rotation speed may be constant or may vary. At this time, an SiC single crystal is formed and grown on the crystal growth surface of the SiC seed crystal 32. The seed shaft 28 may not be rotated.

[Heat Removal Method]

During the growth step discussed above, heat is removed from the bottom portion 14B of the crucible 14 (heat removal step). An arrangement for removing heat from the bottom portion 14B will be described with reference to FIG. 2.

The rotation shaft 24 includes a pedestal 34 and a shaft 36.

The pedestal 34 is made of graphite. The pedestal 34 is in direct contact with the bottom surface 141 of the crucible 14 to support the crucible 14. That is, the pedestal 34 contacts the bottom portion 14B of the crucible 14 without an heat-insulating material located in between, and thus supports the crucible 14.

With the pedestal 34 supporting the crucible 14, a protrusion 14C formed on the bottom surface 141 of the crucible 14 fits into a recess 34A formed on the upper surface 341 of the pedestal 34. This stabilizes the crucible 14 supported by the pedestal 34.

Alternatively, when the pedestal 34 supports the crucible 14, it is not necessary that a protrusion 14C fit into a recess 34A. For example, the bottom surface of the crucible 14 and the upper surface of the pedestal 34 may be flat.

Figure 2:
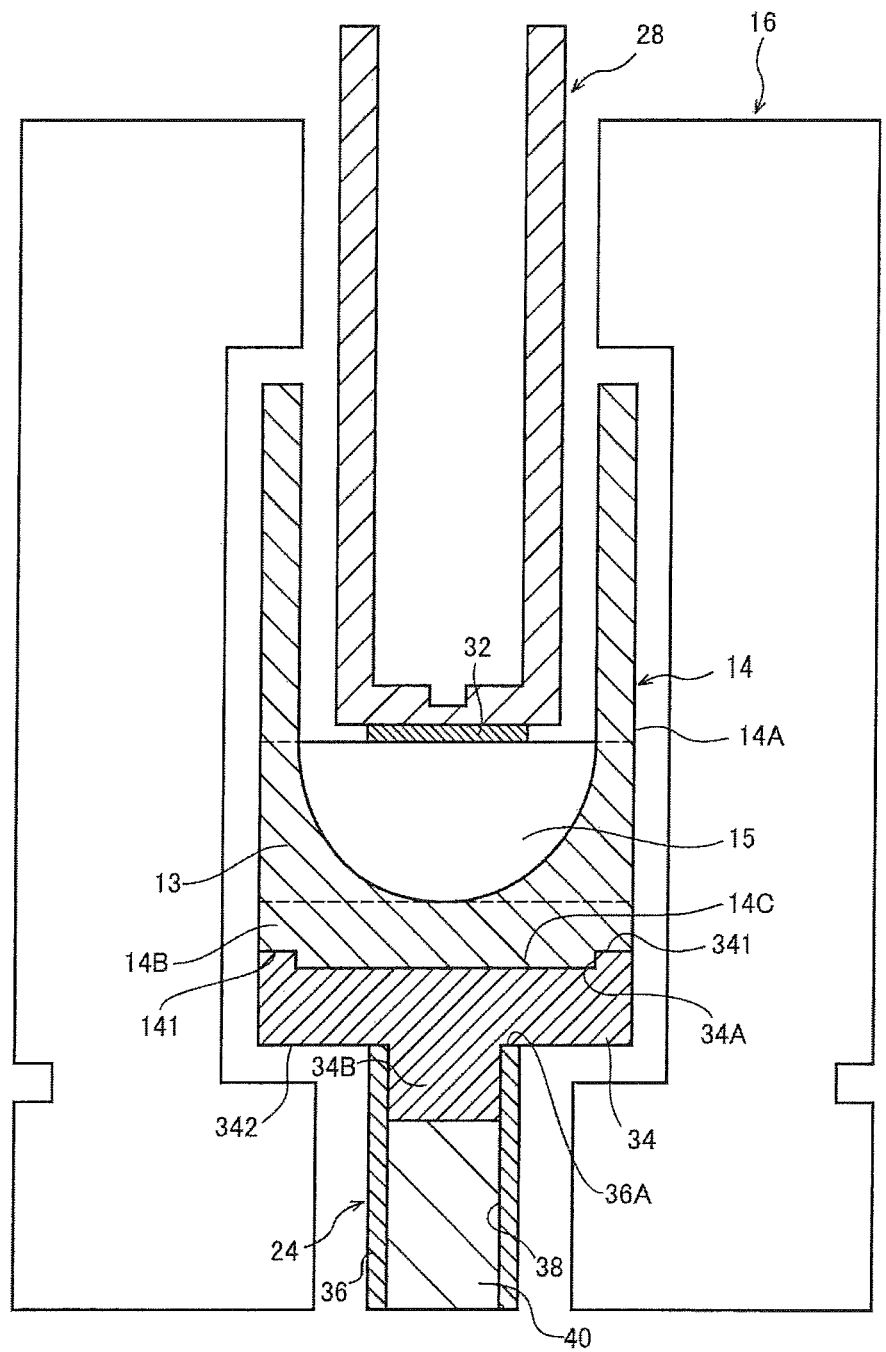
FIG. 2 is a schematic view of a portion of the apparatus for illustrating the heat removal method.

In the implementation shown in FIG. 2, the entire upper surface of the pedestal 34 is in contact with the bottom portion 14B. This makes it easier to ensure that a certain amount of heat is transferred from the bottom portion 14B to the pedestal 34.

In the implementation shown in FIG. 2, the surface area of the bottom portion 14b as viewed in the height direction of the crucible 14 (hereinafter referred to as projected area of the bottom portion 14B in the height direction) is the same as the projected area of the pedestal 34 as viewed in the height direction of the rotation shaft 24. Thus, the pedestal 34 is not larger than necessary and the crucible 14 is supported in a stable manner.

The shaft 36 is made of graphite. The shaft 36 extends in the top-to-bottom direction. A hole 38 is formed in the shaft 36 to extend in the top-to-bottom direction. The hole 38 opens at the upper end surface 36A of the shaft 36. The shaft 36 is rotated by the drive power source 26. The shaft 36 is in direct contact with the bottom surface 342 of the pedestal 34 to support the pedestal 34. That is, the shaft 36 is in contact with the pedestal 34 without a heat-insulating material located in between, and thus supports the pedestal 34.

With the shaft 36 supporting the pedestal 34, a protrusion 34B formed on the bottom surface 342 of the pedestal 34 fits into the hole 38. Thus, the pedestal 34 is supported by the shaft 36 in a stable manner. Alternatively, no protrusion 34B may be provided.

In the present embodiment, a felt-like heat-insulating member 40 is positioned inside the hole 38. As a result, the pedestal 34 and shaft 36 form a heat removal route for the bottom portion 14B. That is, heat is removed from the bottom portion 14B by heat transfer, not by radiation. In short, in the present embodiment, only the contact portion constituted by the pedestal 34 and shaft 36 constitutes the heat removing portion.

The projected area of the shaft 36 in the height direction, i.e. the cross-sectional area of the shaft 36 is decided depending on the needed heat removal characteristics. The cross-sectional area of the shaft 36 is preferably 10% or more of the projected area of the bottom portion 14B in the height direction, or more preferably 20% or more of the projected area of the bottom portion 14B in the height direction.

Figure 3:
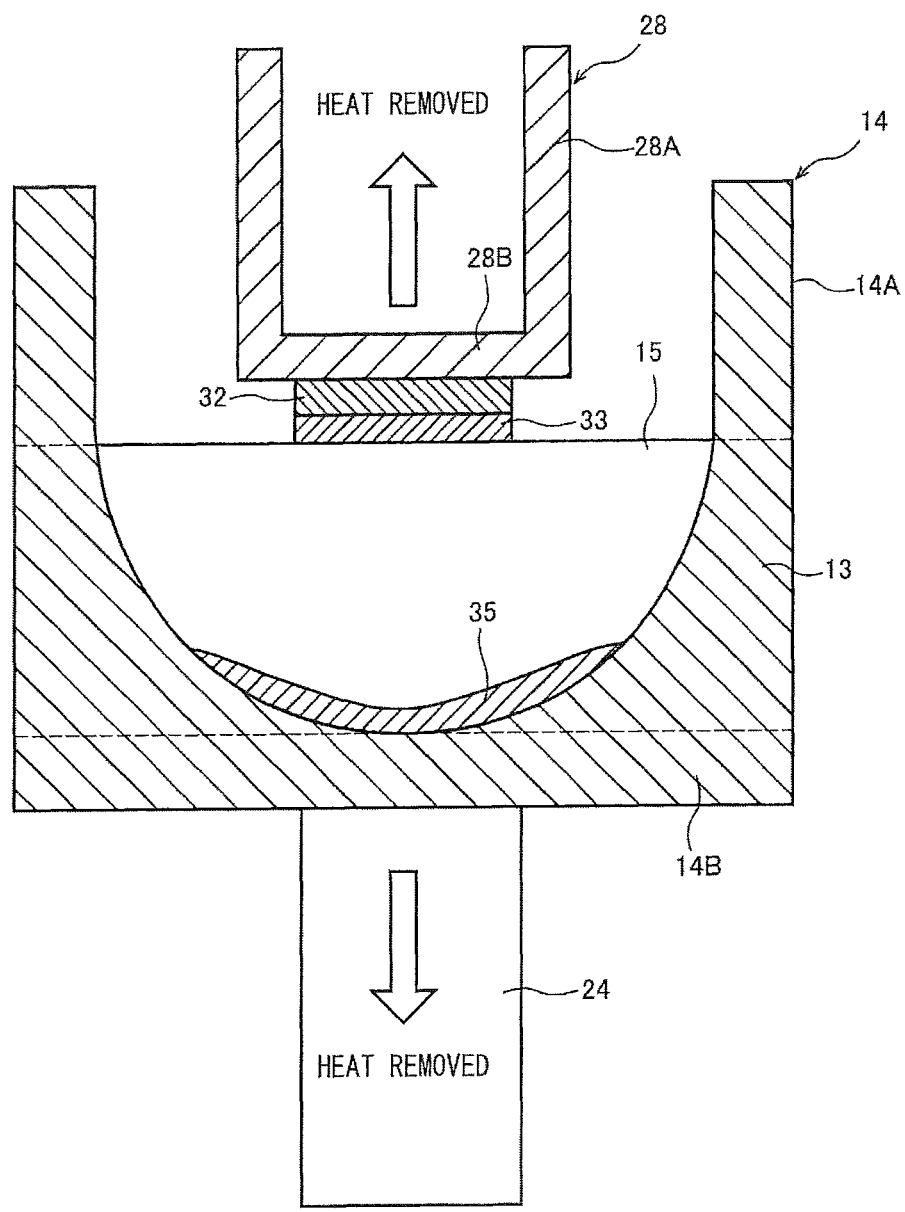
FIG. 3 is a schematic view of a portion of the apparatus for illustrating how SiC polycrystalline material is formed on the bottom of the crucible.

As discussed above, the rotation shaft 24 supports the bottom portion 14B of the crucible 14 without a heat-insulating material located in between. Thus, heat is removed from the bottom portion 14B during the production step discussed above. Thus, an SiC single crystal grows in a stable manner on the SiC seed crystal 32. The reason for this will be discussed with reference to FIG. 3.

When an SiC single crystal 33 is produced, regions of the Si—C solution 15 that are near the SiC seed crystal 32 are supercooled, as discussed above. In the present embodiment, the seed shaft 28 includes a cylindrical portion 28A and a bottom portion 28B. The bottom portion 28B covers the opening of the cylindrical portion 28A at its lower end. The SiC seed crystal 32 is attached to the lower surface of the bottom portion 28B. In the present embodiment, heat is removed from the bottom portion 28B by radiation. As heat is removed from the bottom portion 28B, heat is removed from the SiC seed crystal 32. As heat is removed from the SiC seed crystal 32, regions of the Si—C solution 15 that are near the SiC seed crystal 32 are supercooled. As the regions near the SiC seed crystal 32 are supercooled, the regions are supersaturated with SiC.

To improve the quality of the SiC single crystal 33, the degree of supersaturation of the regions near the SiC seed crystal 32 is suitably adjusted to an appropriate level.

As discussed above, heat is removed from the bottom portion 14B during production of the SiC single crystal 33. As heat is removed from the bottom portion 14B, regions of the Si—C solution 15 that are near the bottom portion 14B are supercooled. As the regions near the bottom portion 14B are supercooled, the regions are supersaturated with SiC. When the degree of supersaturation of the regions near the bottom portion 14B with SiC increases excessively, SiC polycrystalline material 35 is formed on the bottom portion 14B. When the SiC polycrystalline material 35 is formed on the bottom portion 14B, the concentration of SiC in the Si—C solution 15 decreases. This prevents the degree of supersaturation of the regions near the SiC seed crystal 32 with SiC from increasing excessively. As a result, SiC polycrystalline material is less likely to be formed on and near the SiC seed crystal 32.

The above production method causes an SiC single crystal 33 to grow on the SiC seed crystal 32 in a stable manner. This improves the quality of the SiC single crystal 33.

Particularly, since the above production method removes heat directly from the bottom portion 14B, SiC polycrystalline material 35 can be formed more easily on the bottom portion 14B than in implementations where the heating conditions of the crucible 14 are controlled by a high-frequency coil 18 to create temperature gradients in regions of the Si—C solution 15 that are near the bottom portion 14B. This further reduces the concentration of SiC in the Si—C solution 15. This further prevents the degree of supersaturation of the regions near the SiC seed crystal 32 with SiC from increasing excessively.

Further, in the above production method, removing heat from the SiC seed crystal 32 supercools the regions of the Si—C solution 15 that are near the SiC seed crystal 32. Thus, regions of the side wall 14B that are in contact with the liquid surface of the Si—C solution 15 are unlikely to become cool. As such, SiC polycrystalline material is unlikely to be formed in these regions, and thus the SiC single crystal 33 is not prevented from growing by this SiC polycrystalline material.

Furthermore, in the production apparatus 10, the side wall 14A includes a lower end portion 13 connected with the bottom portion 14B. The thickness of the lower end portion 13 is larger than the thickness of portions of the side wall 14A located as high as the liquid surface of the Si—C solution 15.

In this case, SiC polycrystalline material is less likely to be formed in regions of the side wall 14A that are in contact with the liquid surface of the Si—C solution 15. The reason for this may be the following.

In the above arrangement, the heat capacity of the side wall 14A, especially the heat capacity of its lower end portion 13 is relatively large. Thus, even when heat is removed from the bottom portion 14B, heat in the side wall 14A is unlikely to be removed. As a result, SiC polycrystalline material is unlikely to be formed in regions of the side wall 14A that are in contact with the liquid surface of the Si—C solution 15.

The regions of the side wall 14A that are in contact with the liquid surface of the Si—C solution 15 are distant from the bottom portion 14B, i.e. the portion of the crucible 14 from which heat is removed. In addition, the regions of the side wall 14A that are in contact with the liquid surface of the Si—C solution 15 are closer to the heating device 18 than to the shaft 36 that constitutes a part of the heat removal route. Thus, the regions of the side wall 14A that are in contact with the liquid surface of the Si—C solution 15 can easily be heated. As a result, SiC polycrystalline material is unlikely to be formed on the regions of the side wall 14A that are in contact with the liquid surface of the Si—C solution 15.

The thickness of the lower end of the side wall 14A, i.e. the maximum thickness of the side wall 14A (i.e. lower end portion 13) is preferably ¼ to ½ of the width of the side wall 14A (i.e. outer diameter of the side wall 14A if the side wall 14 is cylindrical). In other words, the thickness of the lower end of the side wall 14A is ¼ to ½ of the width of the bottom portion 14B (i.e. diameter of the bottom portion 14B if the bottom portion 14B is in the shape of a disc). The height of the lower end portion 13, i.e. the height of the portions of the side wall 14A whose thickness changes as it goes in the height direction is preferably ½ or more of the height of the side wall 14A.

In the production apparatus 10, the crucible 14, pedestal 34 and shaft 36 are all made of graphite. This facilitates removal of heat by the pedestal 34 and shaft 36 from the bottom portion 14B.

The material of the crucible 14, pedestal 34 and shaft 36 is not limited to graphite. For example, the pedestal 34 and shaft 36 may be formed of a material with a higher thermal conductivity than graphite.

[Example Applications of Heat Removal Method]

Example applications of the method of removing heat from the bottom portion 14B will be described with reference to FIGS. 4 to 8.

Figure 4:
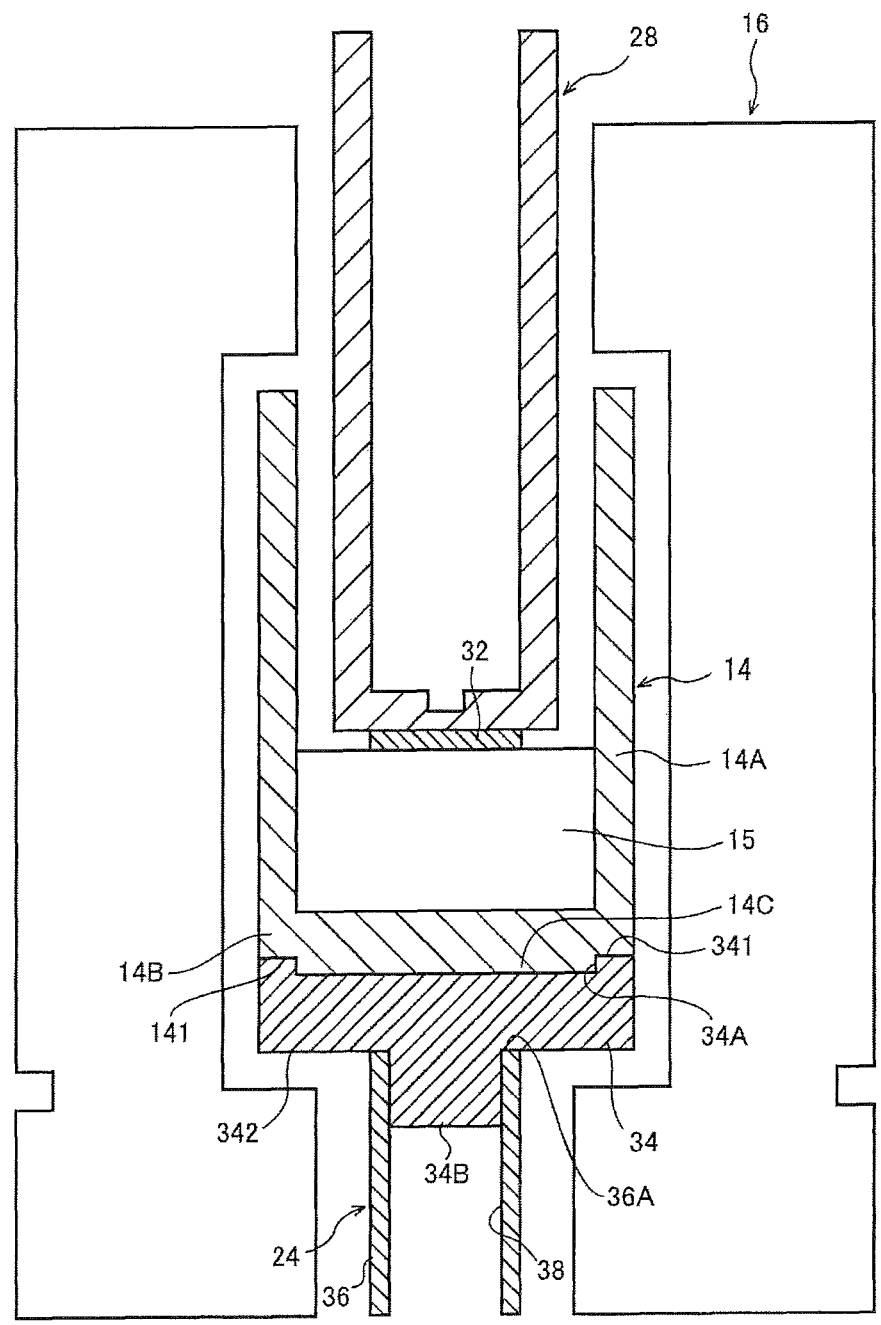
FIG. 4 is a schematic view of a portion of the apparatus for illustrating an example application of the heat removal method.

As shown in FIG. 4, no heat-insulating member 40 may be provided. In this case, heat is removed from the pedestal 34 by radiation in addition to the heat removal by heat transfer discussed above. This makes it easier to remove heat from the bottom portion 14B.

The area of the hole 38 as viewed in the height direction of the shaft 36, i.e. the opening area of the hole 38 is decided depending on the needed heat removal characteristics. The opening area of the hole 38 is preferably 3% or more of the projected area of the bottom portion 14B in the height direction, or more preferably 5% or more of the projected area of the bottom portion 14B in the height direction, or still more preferably 10% or more of the projected area of the bottom portion 14B in the height direction.

In the implementation shown in FIG. 4, the heat removal characteristics can be adjusted by appropriately deciding at least one of the opening area of the hole 38 and the cross-sectional area of the shaft 36, for example.

Figure 5:
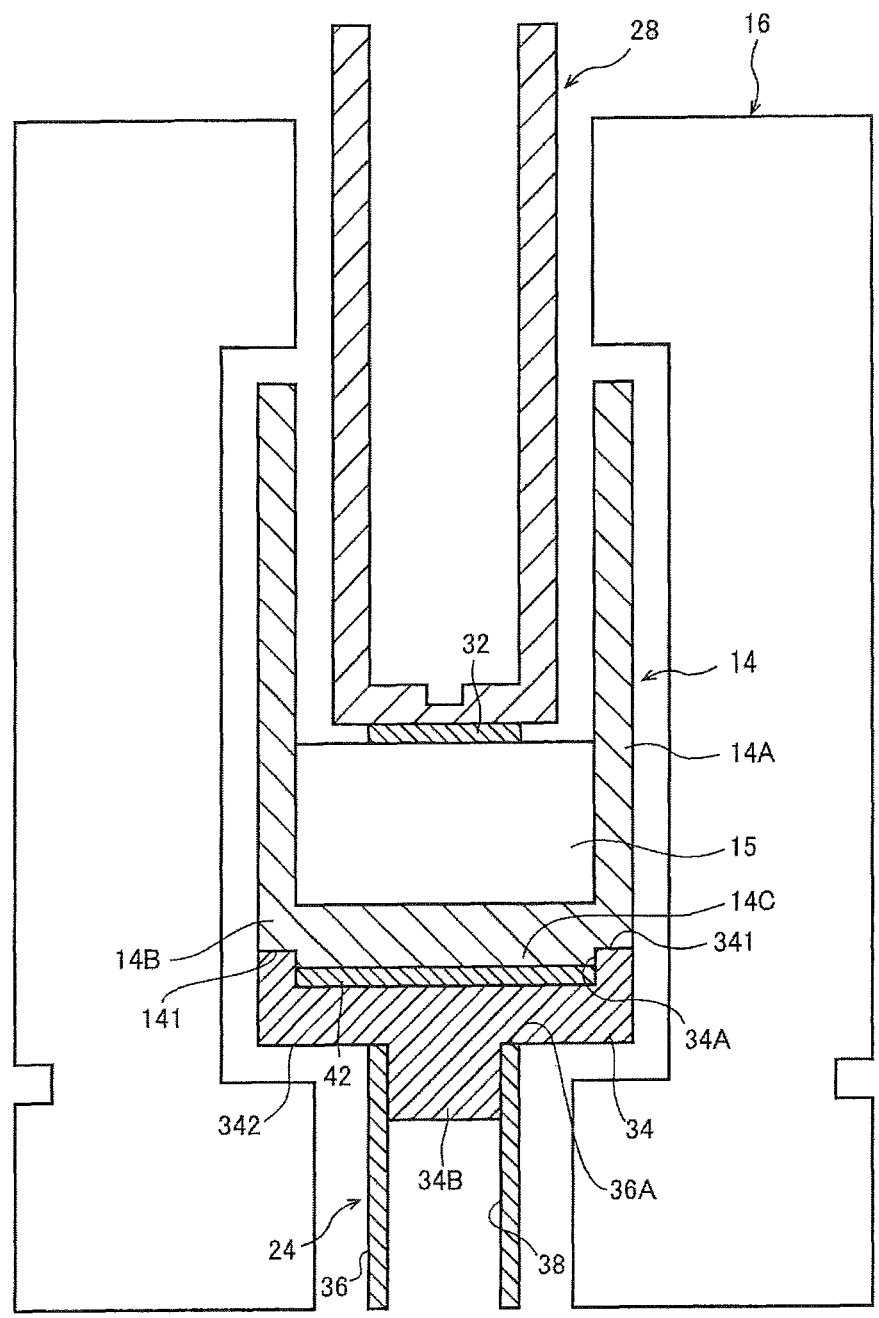
FIG. 5 is a schematic view of a portion of the apparatus for illustrating an example application of the heat removal method.

To reduce the amount of heat to be removed, a heat-insulating member 42 may be positioned between the end surface of the protrusion 14C and the bottom surface of the recess 34A, as shown in FIG. 5.

In the implementations shown in FIGS. 4 and 5, the crucible 14 does not feature the lower end portion 13.

Figure 6A:
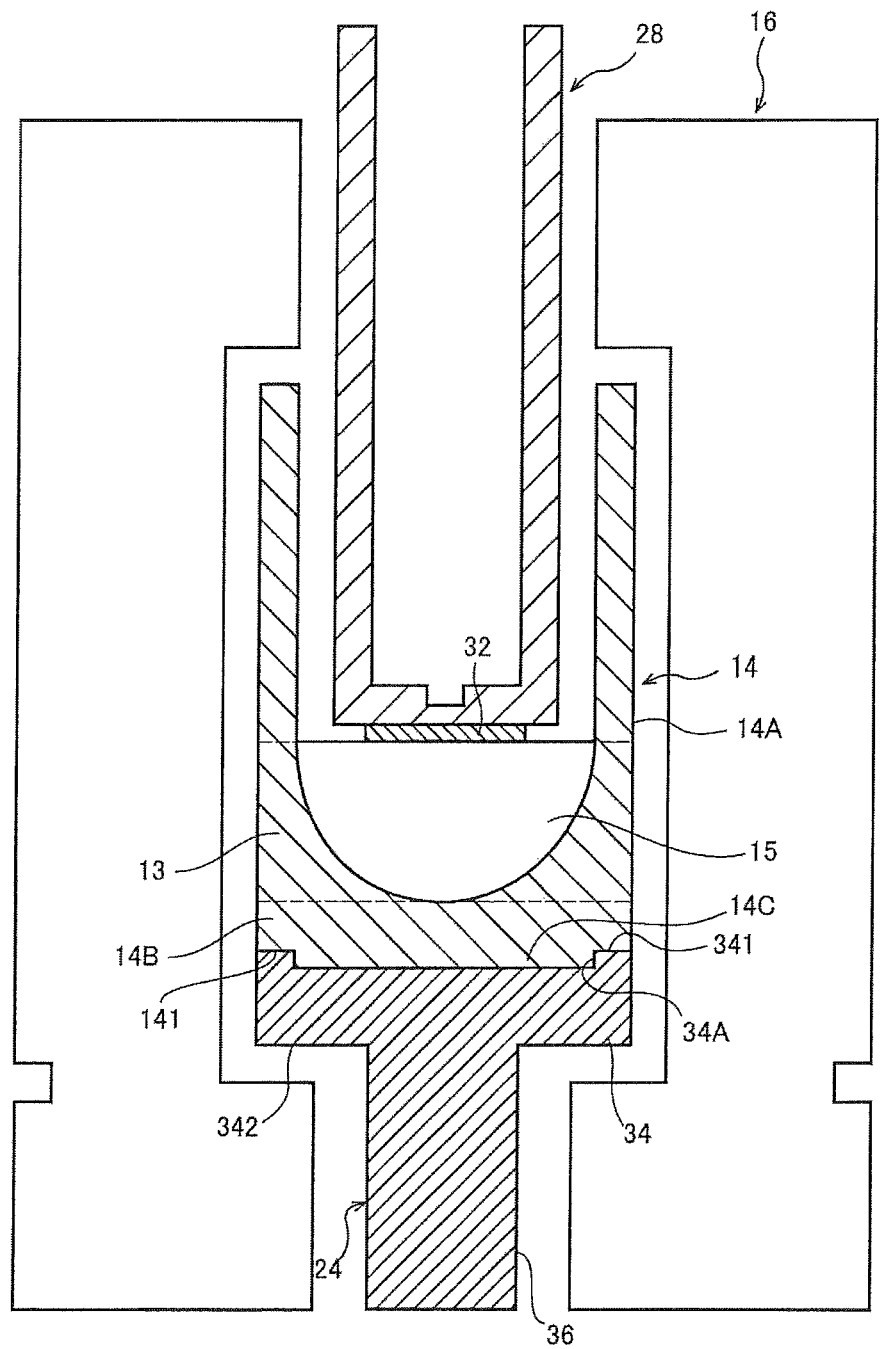
FIG. 6A is a schematic view of a portion of the apparatus for illustrating an example application of the heat removal method.

As shown in FIG. 6A, the shaft 36 may be solid and integrally formed with the pedestal 34. In this case, the pedestal 34 and shaft 36 form a heat removal route. That is, heat is removed from the bottom portion 14B by heat transfer.

The cross-sectional area of the shaft 36 is decided depending on the needed heat removal characteristics. The cross-sectional area of the shaft 36 is preferably 10% or more of the projected area of the bottom portion 14B in the height direction, or more preferably 20% or more of the projected area of the bottom portion 14B in the height direction.

Figure 6B:
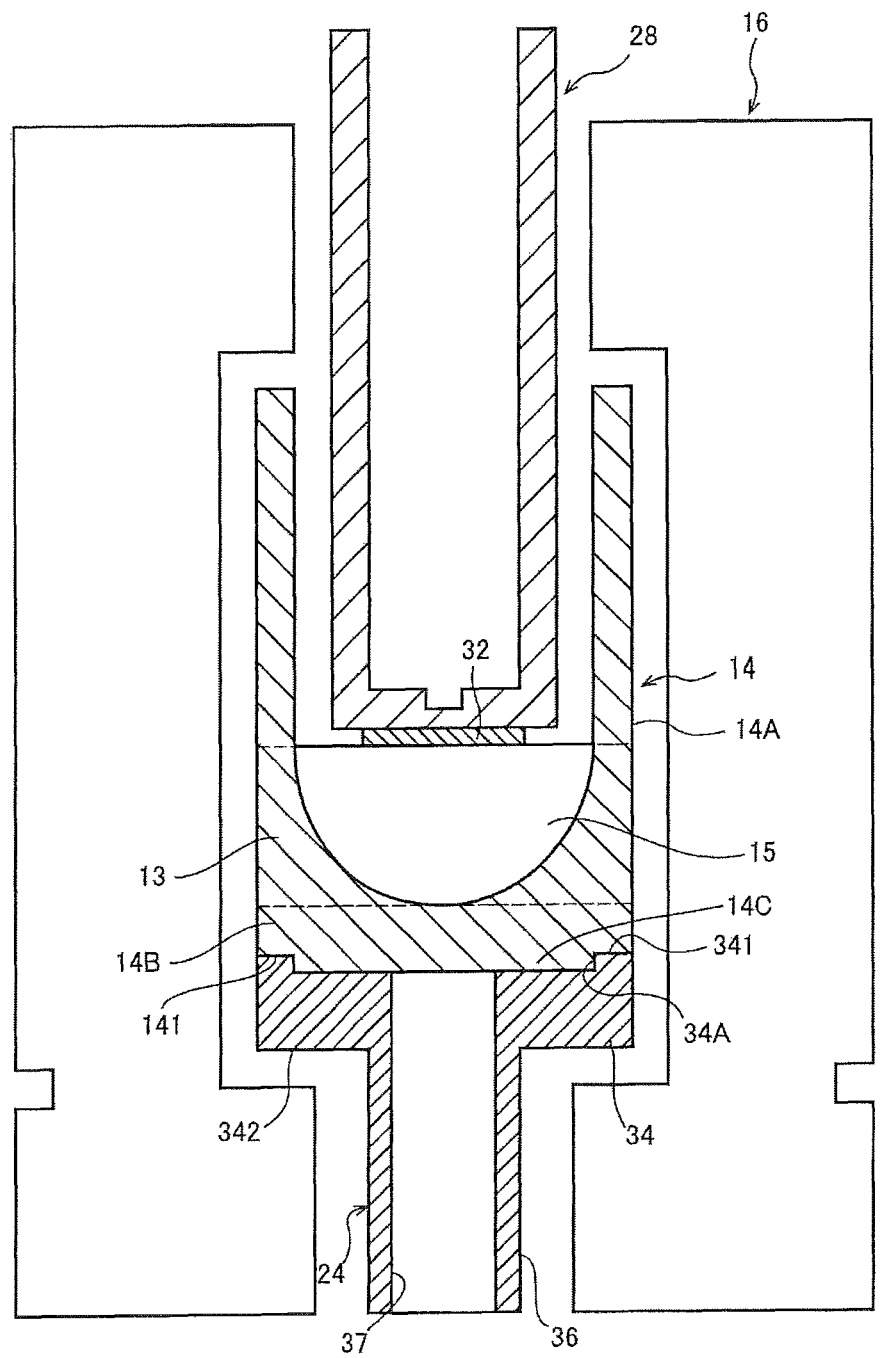
FIG. 6B is a schematic view of a portion of the apparatus for illustrating an example application of the heat removal method.

As shown in FIG. 6B, the rotation shaft 24 may have a hole 37 running through the pedestal 34 and shaft 36 in the top-to-bottom direction, with the inner space contacting the bottom portion 14B. In this case, in addition to the heat removal route formed by the pedestal 34 and shaft 36 (i.e. heat removal route using heat transfer), a heat removal route using radiation in the inner space of the hole 37 is formed. That is, the contact portion constituted by the pedestal 34 and shaft 36 and the space constituted by the hole 37 constitute the heat removing portion. In this variation, the pedestal 34 and shaft 36 may be formed of a heat-insulating material, for example. That is, the heat removal route may only use radiation in the inner space of the hole 37. In other words, the heat removing portion may be constituted only by the space formed by the hole 37.

The area of the hole 37 as viewed in the height direction of the rotation shaft 24, i.e. the opening area of the hole 37, is preferably 3% or more of the projected area of the bottom portion 14B in the height direction, or more preferably 5% or more of the projected area of the bottom portion 14B in the height direction, or still more preferably 10% or more of the projected area of the bottom portion 14B in the height direction.

In the implementation shown in FIG. 6B, the heat removal characteristics can be adjusted by appropriately deciding at least one of the opening area of the hole 37 and the cross-sectional area of the shaft 36, for example.

Figure 7:
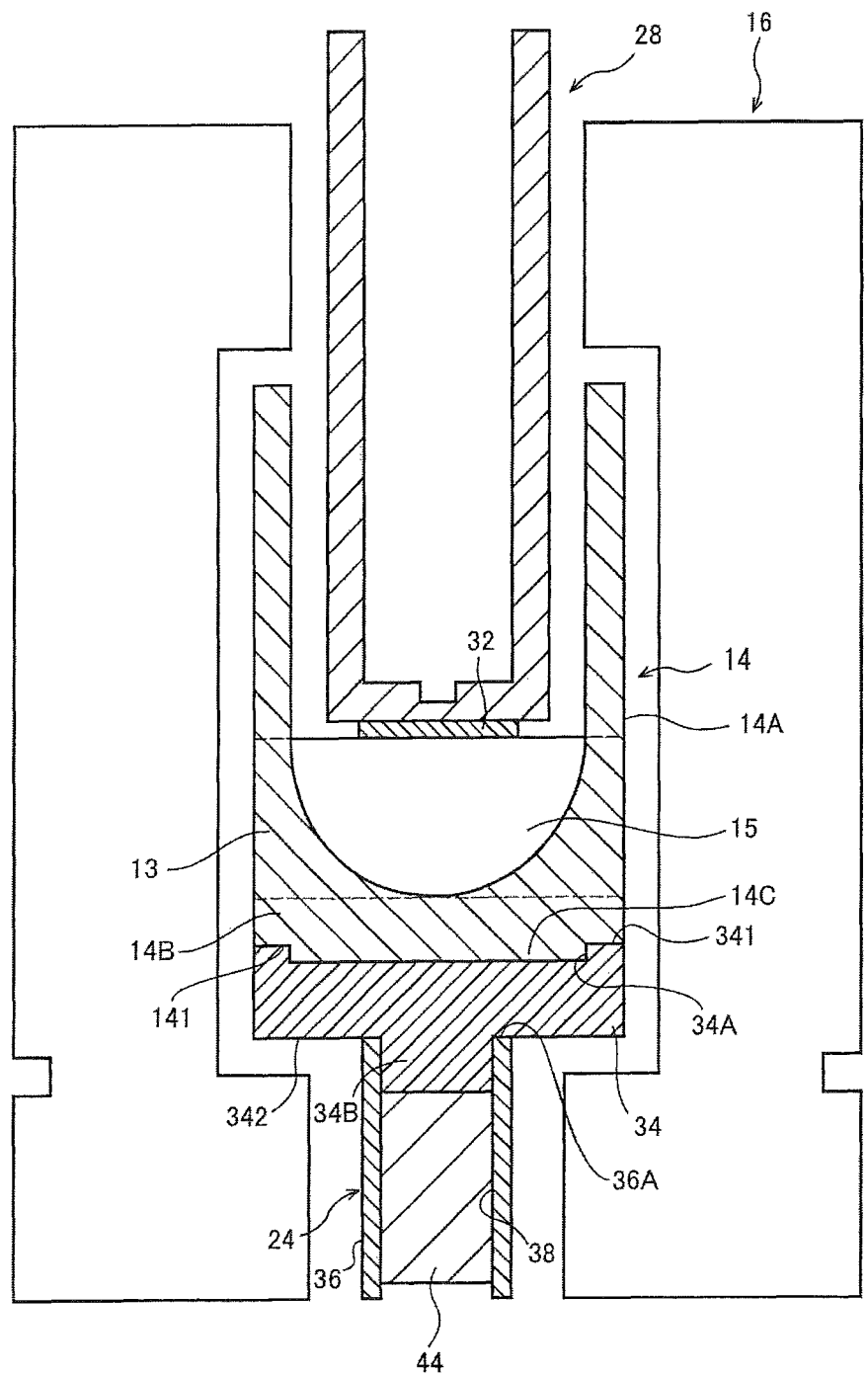
FIG. 7 is a schematic view of a portion of the apparatus for illustrating an example application of the heat removal method.

As shown in FIG. 7, a heat transfer member 44 may be positioned in the hole 38 to contact the protrusion 34B. In this case, the pedestal 34, shaft 36 and heat transfer member 44 form a heat removal route. That is, heat is removed from the bottom portion 14B by heat transfer.

The thermal conductivity of the heat transfer member 44 is only required to be equal to or higher than the thermal conductivity of the bottom portion 14B, and is preferably higher than the thermal conductivity of the bottom portion 14B, and preferably equal to or higher than the thermal conductivity of the pedestal 34. The heat transfer member 44 is made of boron nitride (BN), silicon carbide (SiC), aluminum nitride (AlN) or the like, for example.

In the implementation shown in FIG. 7, heat is removed from the pedestal 34 via the heat transfer member 44 in addition to the heat removal by heat transfer discussed above (i.e. heat removal via the pedestal 34 and shaft 36). This promotes removal of heat by the pedestal 34 from the bottom portion 14B.

The surface area of the heat transfer member 44 as viewed in the height direction of the shaft 36, that is, the projected area of the heat transfer member 44 in the height direction, is preferably 3% or more of the projected area of the bottom portion 14B in the height direction, or more preferably 5% or more of the projected area of the bottom portion 14B in the height direction, or still more preferably 10% or more of the projected area of the bottom portion 14B in the height direction.

In the implementation shown in FIG. 7, the heat removal characteristics can be adjusted by appropriately deciding at least one of the projected area of the heat transfer member 44 in the height direction and the cross-sectional area of the shaft 36, for example.

Figure 8:
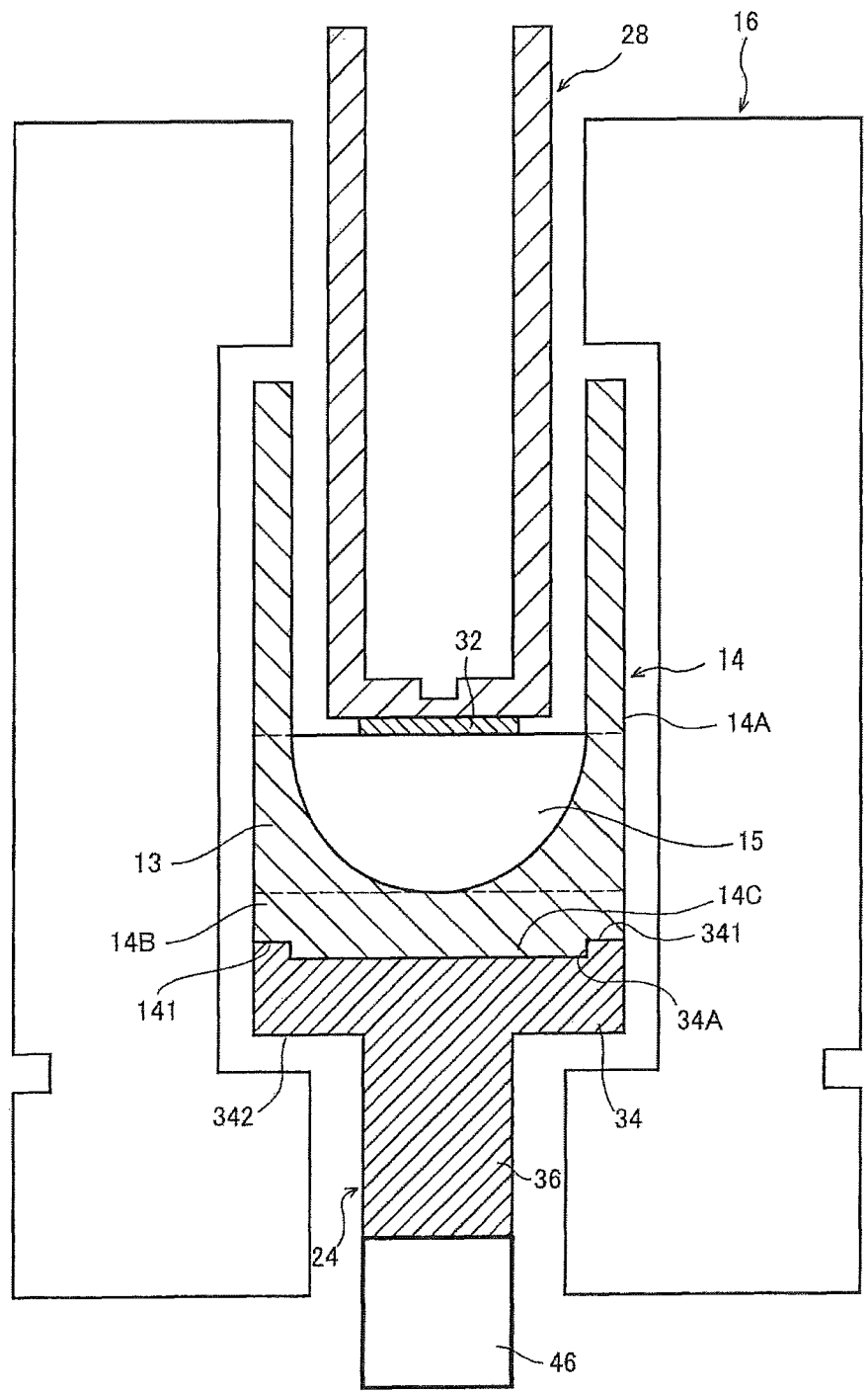
FIG. 8 is a schematic view of a portion of the apparatus for illustrating an example application of the heat removal method.

As shown in FIG. 8, the apparatus may further include a cooling unit 46 for cooling the shaft 36. The cooling unit 46 uses a coolant to cool the shaft 36. The coolant may be liquid or gaseous. In the implementation shown in FIG. 8, the shaft 36 is solid and integrally formed with the pedestal 34.

In the implementation shown in FIG. 8, the cooling unit 46 cools the shaft 36 and pedestal 34. This promotes removal of heat by the pedestal 34 from the bottom portion 14B.

Although not shown, the crucible 14 and pedestal 34 may be integrally formed. Alternatively, the rotation shaft 24 may include no pedestal 34; that is, the shaft 36 may directly support the crucible 14.

EXAMPLES

SiC single crystals were produced while heat was removed from the bottom portion of the crucible (Inventive Examples 1 to 3). For comparison, an SiC single crystal was produced without removing heat from the bottom portion of the crucible (comparative example). Then, the qualities of the produced SiC single crystals were evaluated.

[Production Conditions for Inventive Example 1]

In Inventive Example 1, the arrangement shown in FIG. 2 was used to remove heat from the bottom portion of the crucible. The composition of the raw material for an Si—C solution was, in atomic ratio, Si:Cr=6:4. The temperature of regions of the Si—C solution that were near the SiC seed crystal (i.e. crystal growth temperature) was 1870° C. The temperature gradient of the regions near the SiC seed crystal was 12° C./cm. The temperature gradient of the regions near the bottom portion of the crucible was 15° C./cm. The SiC seed crystal was an SiC seed crystal with 4H polytype. The crystal growth surface of the SiC seed crystal was the (000-1) plane. The growth time was 5 hours.

[Production Conditions for Inventive Example 2]

In Inventive Example 2, the arrangement shown in FIG. 4 was used to remove heat from the bottom portion of the crucible. The composition of the raw material for an Si—C solution was, in atomic ratio, Si:Cr=6:4. The temperature of regions of the Si—C solution that were near the SiC seed crystal (i.e. crystal growth temperature) was 1940° C. The temperature gradient of the regions near the SiC seed crystal was 10° C./cm. The temperature gradient of the regions near the bottom portion of the crucible was 15° C./cm. The SiC seed crystal was an SiC seed crystal with 411 polytype. The crystal growth surface of the SiC seed crystal was the (000-1) plane. The growth time was 10 hours.

[Production Conditions for Inventive Example 3]

In Inventive Example 3, the arrangement shown in FIG. 6B was used to remove heat from the bottom portion of the crucible. The composition of the raw material for an Si—C solution was, in atomic ratio, Si:Cr=6:4. The temperature of regions of the Si—C solution that were near the SiC seed crystal (i.e. crystal growth temperature) was 1955° C. The temperature gradient of the regions near the SiC seed crystal was 8° C./cm. The temperature gradient of the regions near the bottom portion of the crucible was 12° C./cm. The SiC seed crystal was an SiC seed crystal with 411 polytype. The crystal growth surface of the SiC seed crystal was the (000-1) plane. The growth time was 5 hours.

[Production Conditions for Comparative Example]

Figure 9:
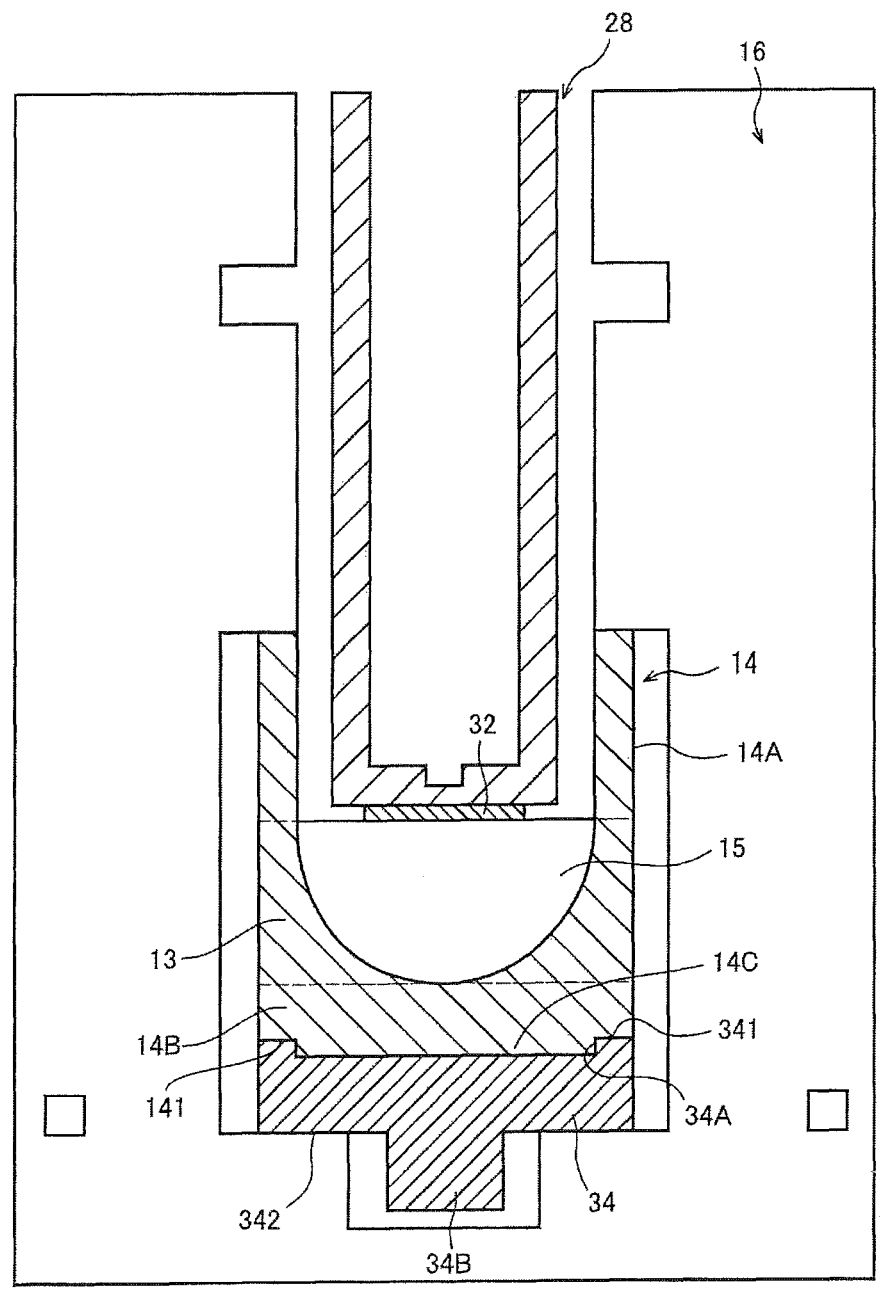
FIG. 9 is a schematic view of a portion of a production apparatus used to produce an SiC single crystal of a comparative example, showing the support structure of the crucible.
Figure 10:
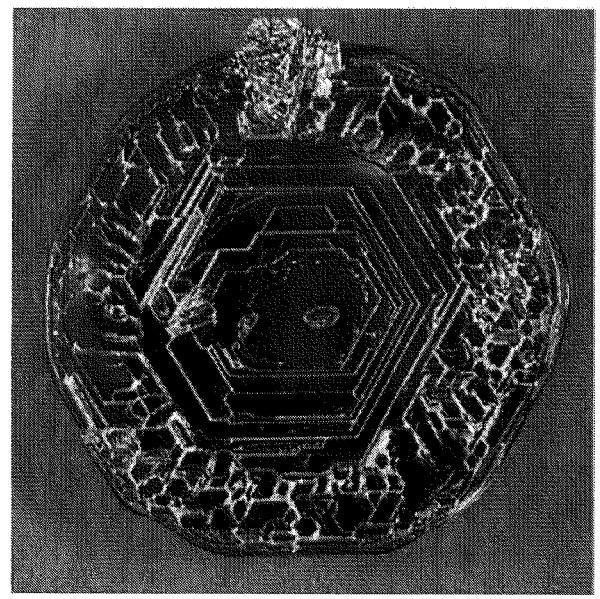
FIG. 10 is a photograph of a surface of the SiC single crystal of Inventive Example 1.
Figure 11:
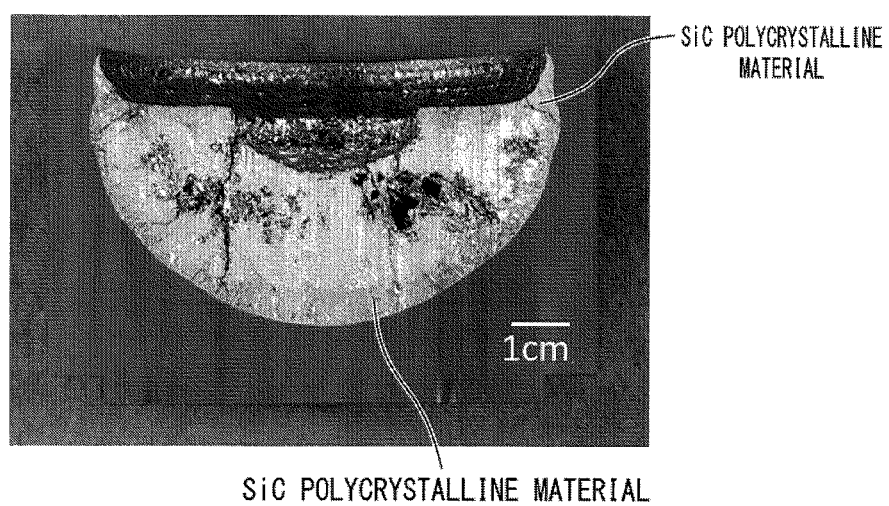
FIG. 11 is a photograph of a cross-section of the crucible after the SiC single crystal of Inventive Example 1 was produced.
Figure 12:
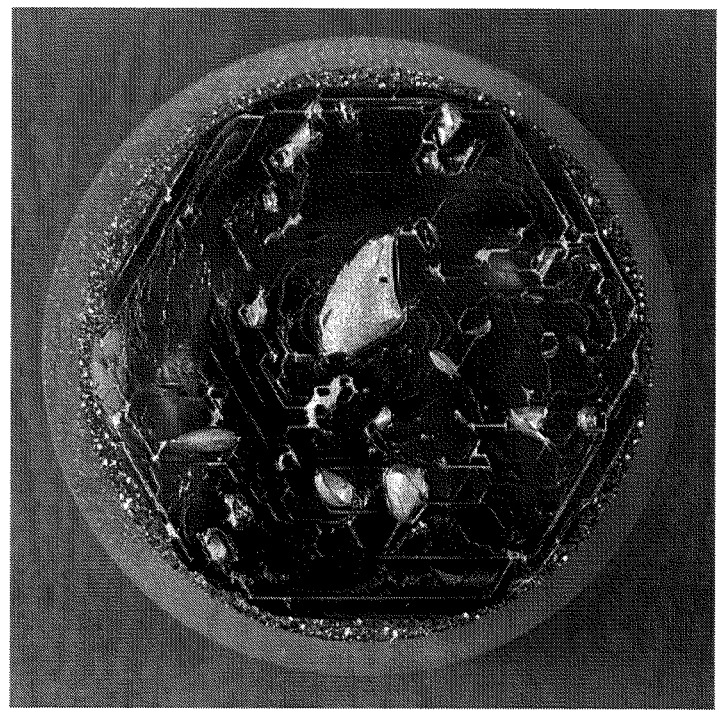
FIG. 12 is a photograph of a surface of the SiC single crystal of Inventive Example 2.
Figure 13:
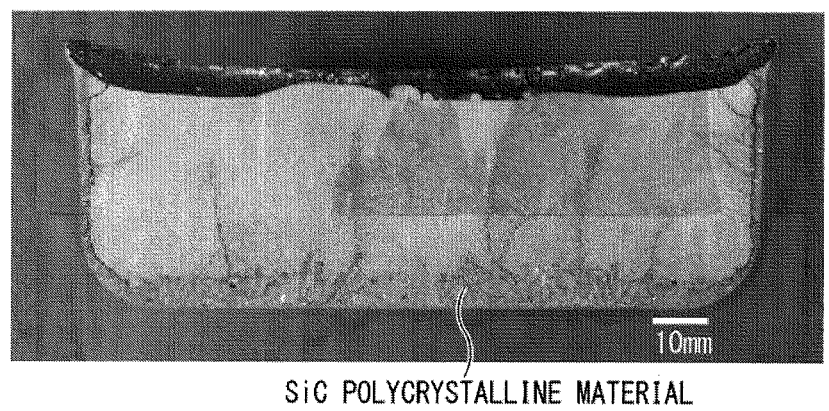
FIG. 13 is a photograph of a cross-section of the crucible after the SiC single crystal of Inventive Example 2 was produced.
Figure 14:
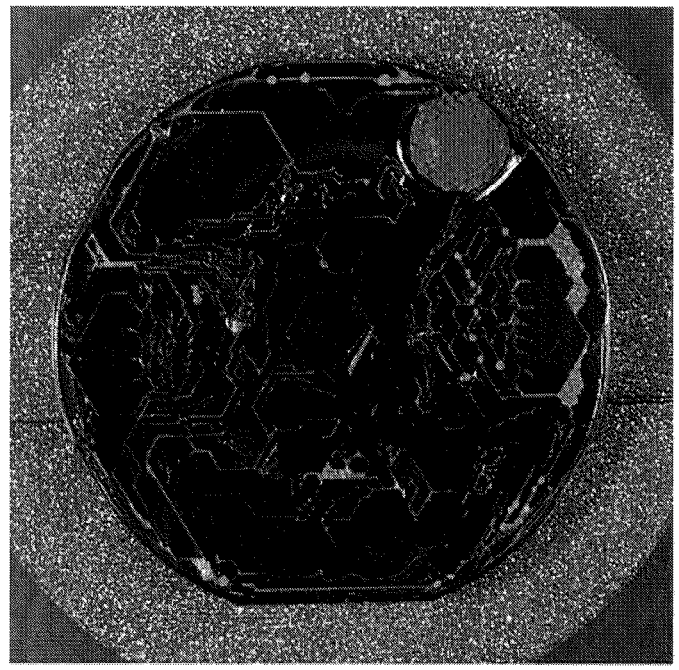
FIG. 14 is a photograph of a surface of the SiC single crystal of Inventive Example 3.
Figure 15:
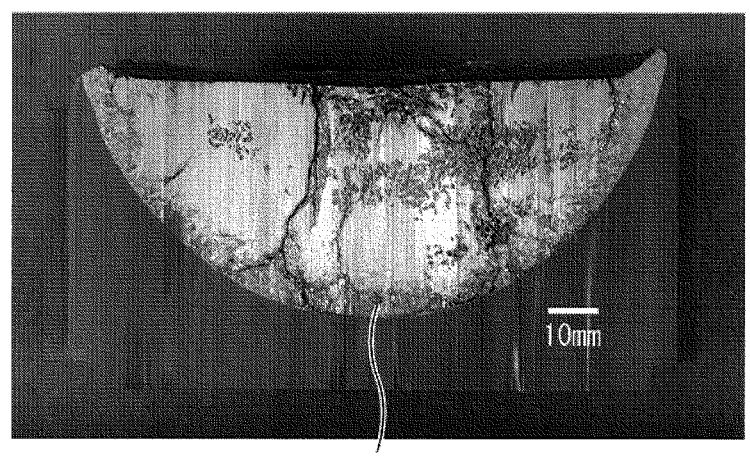
FIG. 15 is a photograph of a cross-section of the crucible after the SiC single crystal of Inventive Example 3 was produced.
Figure 16:
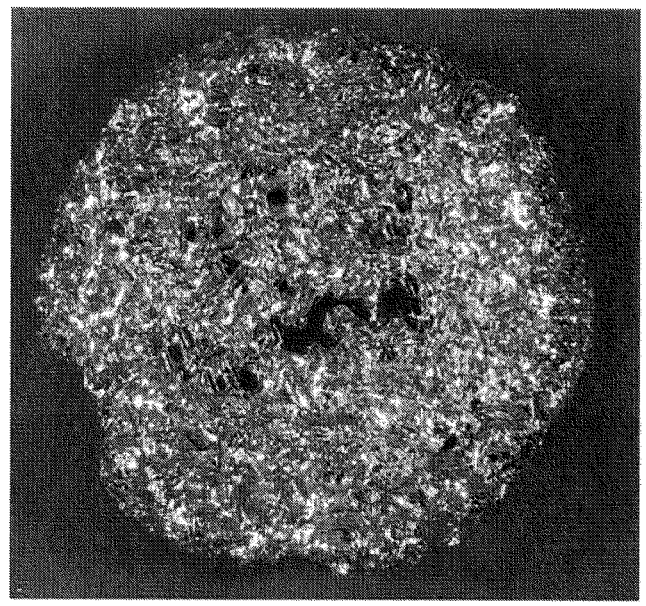
FIG. 16 is a photograph of a surface of the SiC single crystal of the comparative example.
Figure 17:
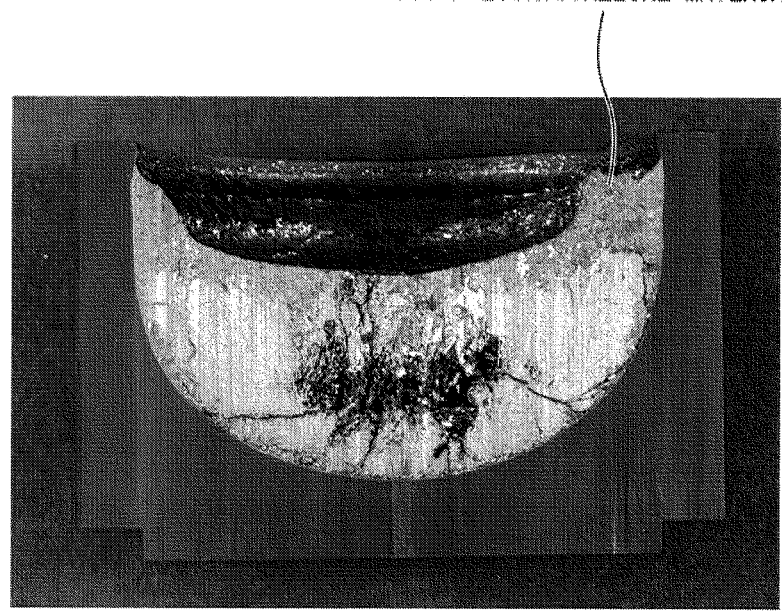
FIG. 17 is a photograph of a cross-section of the crucible after the SiC single crystal of the comparative example was produced.

In the comparative example, no shaft 36 was provided, as shown in FIG. 9. Further, the pedestal 34 was supported by the heat-insulating member 16. The composition of the raw material for an Si—C solution was, in atomic ratio, Si:Cr=6:4. The temperature of regions of the Si—C solution that were near the SiC seed crystal (i.e. crystal growth temperature) was 1880° C. The temperature gradient of the regions near the SiC seed crystal was 10° C./cm. The SiC seed crystal was an SiC seed crystal with 411 polytype. The crystal growth surface of the SiC seed crystal was the (000-1) plane. The growth time was 5 hours. That is, the same conditions were used except for the production apparatus.

[Evaluation Method]

The surfaces of the SiC single crystals produced and the cross-sections of the crucibles after the SiC single crystals were produced were observed. The results are shown in FIGS. 10 to 17.

As shown in FIGS. 10, 12, 14 and 16, the SiC single crystals of Inventive Examples 1 to 3 had smoother surfaces than the SiC single crystal of the comparative example. This is presumably because, as shown in FIGS. 11, 13, 15 and 17, when the SiC single crystals of Inventive Examples 1 to 3 were produced, SiC polycrystalline material could easily be formed on the bottom portions of the crucibles and SiC polycrystalline material could not easily be formed on the side walls of the crucibles than when the SiC single crystal of the comparative example was produced.

Although embodiments of the present invention have been described in detail, these are merely illustrative examples, and the present invention is by no means limited to the above embodiments.

The invention claimed is:

1. A production apparatus employed to produce an SiC single crystal by a solution growth method, comprising:
   a crucible for accommodating an Si—C solution; and
   a support shaft supporting the crucible,
   wherein the support shaft includes a heat removing portion for removing heat from a bottom portion of the crucible, and
   the heat removing portion includes one of
   (a) a contact portion having a thermal conductivity not less than that of the bottom portion and contacting at least a portion of the bottom portion, and
   (b) a space adjacent to at least a portion of the contact portion or the bottom portion.

2. The production apparatus according to claim 1, wherein:
   the support shaft includes:
   a shaft body extending in a top-to-bottom direction; and
   a pedestal located on an upper end of the shaft body and contacting the bottom portion, and
   the contact portion includes the pedestal.

3. The production apparatus according to claim 1, wherein:
   the crucible includes a side wall extending in a top-to-bottom direction and connected with the bottom portion, and
   a lower end portion of the side wall has a thickness greater than that of a portion of the side wall located as high as a liquid surface of the Si—C solution.

4. The production apparatus according to claim 3, wherein the thickness of the lower end portion decreases as it goes upward.

5. The production apparatus according to claim 1, further comprising: a cooling unit that cools the contact portion.

6. A method for producing an SiC single crystal by a solution growth method, comprising:
   a preparation step in which a production apparatus is prepared that includes: a crucible accommodating a raw material for an Si—C solution; and a support shaft supporting the crucible, wherein the support shaft includes a heat removing portion for removing heat from a bottom portion of the crucible, and the heat removing portion includes one of (a) a contact portion having a thermal conductivity not less than that of the bottom portion and contacting at least a portion of the bottom portion, and (b) a space adjacent to at least a portion of the contact portion or the bottom portion;
   a formation step in which the raw material in the crucible is heated so as to melt to form the Si—C solution; and
   a growth step in which an SiC seed crystal is brought into contact with the Si—C solution to cause the SiC single crystal to grow on the SiC seed crystal,
   wherein the growth step includes a heat removal step in which heat is removed from the bottom portion by at least one of a process in which heat is removed by radiation from the bottom portion to the space, a process in which heat is removed by radiation from the contact portion to the space, and a process in which heat is removed by heat transfer from the bottom portion to the contact portion.

* * * * *